United States Patent
Cai et al.

(10) Patent No.: US 9,184,263 B2
(45) Date of Patent: Nov. 10, 2015

(54) METHODS OF FORMING GATE STRUCTURES FOR SEMICONDUCTOR DEVICES USING A REPLACEMENT GATE TECHNIQUE AND THE RESULTING DEVICES

(71) Applicant: GLOBALFOUNDRIES Inc., Grand Cayman (KY)

(72) Inventors: Xiuyu Cai, Niskayuna, NY (US); Ajey Poovannummoottil Jacob, Albany, NY (US); Daniel T. Pham, Clifton Park, NY (US); Mark V. Raymond, Schenectady, NY (US); Christopher M. Prindle, Poughkeepsie, NY (US); Catherine B. Labelle, Wappingers Falls, NY (US); Linus Jang, Clifton Park, NY (US); Robert Teagle, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 14/143,468

(22) Filed: Dec. 30, 2013

(65) Prior Publication Data

US 2015/0187905 A1 Jul. 2, 2015

(51) Int. Cl.
| | |
|---|---|
| *H01L 21/3205* | (2006.01) |
| *H01L 29/66* | (2006.01) |
| *H01L 21/3105* | (2006.01) |
| *H01L 29/06* | (2006.01) |
| *H01L 29/417* | (2006.01) |
| *H01L 29/51* | (2006.01) |
| *H01L 29/423* | (2006.01) |
| *H01L 21/768* | (2006.01) |
| *H01L 29/78* | (2006.01) |

(52) U.S. Cl.
CPC ...... *H01L 29/6681* (2013.01); *H01L 21/31055* (2013.01); *H01L 21/76897* (2013.01); *H01L 29/0692* (2013.01); *H01L 29/4175* (2013.01); *H01L 29/42364* (2013.01); *H01L 29/518* (2013.01); *H01L 29/6656* (2013.01); *H01L 29/7851* (2013.01)

(58) Field of Classification Search
CPC ............ H01L 21/28079; H01L 21/495; H01L 29/512; H01L 21/823864; H01L 29/7845; H01L 29/495; H01L 29/4983; H01L 21/3205; H01L 21/4763
USPC .................................................. 438/586, 595
See application file for complete search history.

(56) References Cited

U.S. PATENT DOCUMENTS

| | | | | |
|---|---|---|---|---|
| 5,723,893 | A * | 3/1998 | Yu et al. ......................... | 257/413 |
| 2005/0003593 | A1 * | 1/2005 | Krivokapic ................... | 438/158 |
| 2007/0200179 | A1 * | 8/2007 | Chen ............................. | 257/369 |
| 2011/0316087 | A1 * | 12/2011 | Pidin ............................. | 257/369 |
| 2012/0139054 | A1 * | 6/2012 | Yin et al. ...................... | 257/369 |

* cited by examiner

*Primary Examiner* — Caridad Everhart
(74) *Attorney, Agent, or Firm* — Amerson Law Firm, PLLC

(57) ABSTRACT

One method disclosed herein includes, among other things, forming sidewall spacers adjacent opposite sides of a sacrificial gate electrode of a sacrificial gate structure, forming a tensile-stressed layer of insulating material adjacent the sidewall spacers, removing the sacrificial gate structure to define a replacement gate cavity positioned between the sidewall spacers, forming a replacement gate structure in the replacement gate cavity, forming a tensile-stressed gate cap layer above the replacement gate structure and within the replacement gate cavity and, after forming the tensile-stressed gate cap layer, removing the tensile-stressed layer of insulating material.

20 Claims, 9 Drawing Sheets

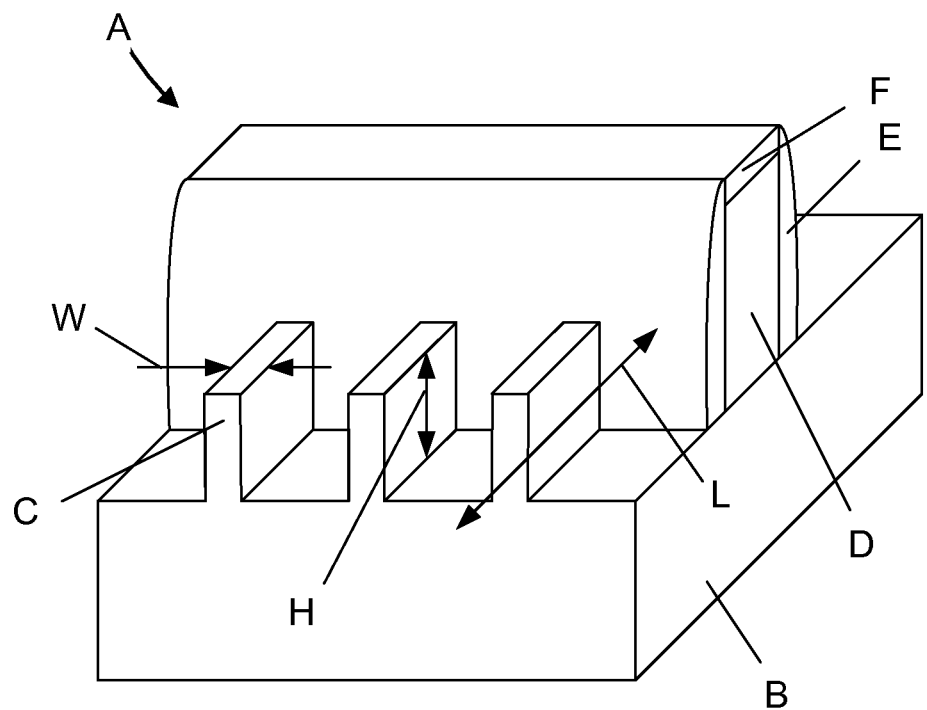
Figure 1A (Prior Art)
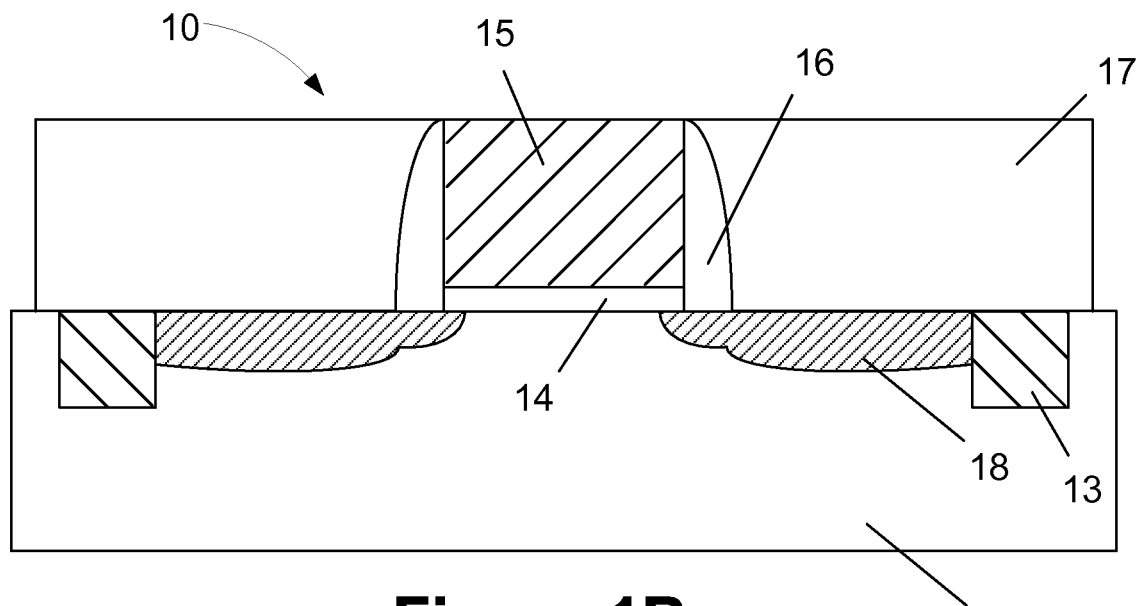
(Prior Art) Figure 1B

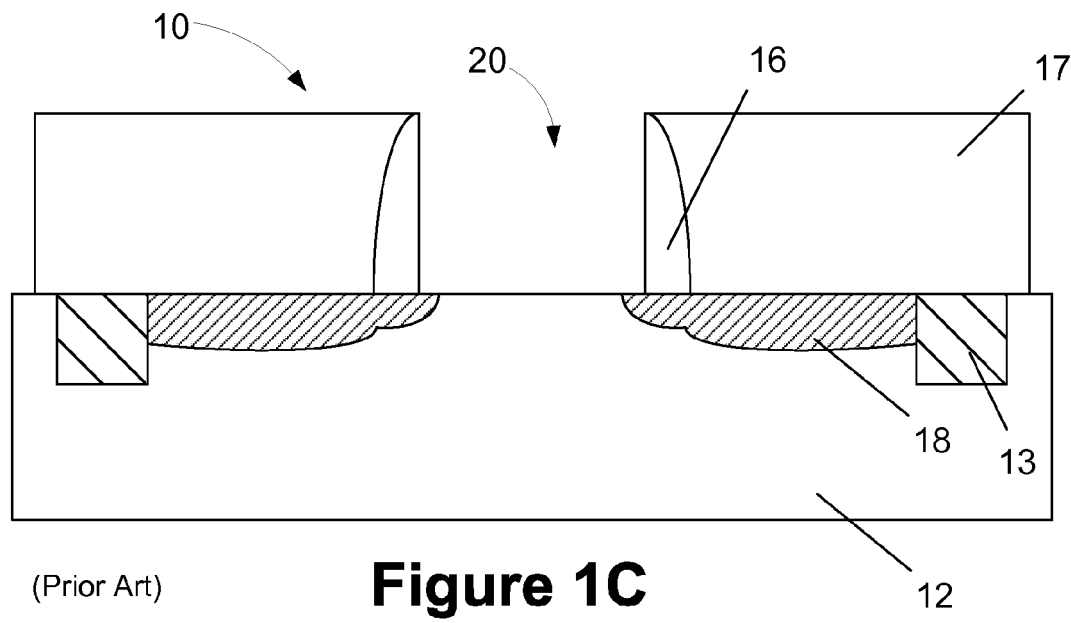
(Prior Art) Figure 1C
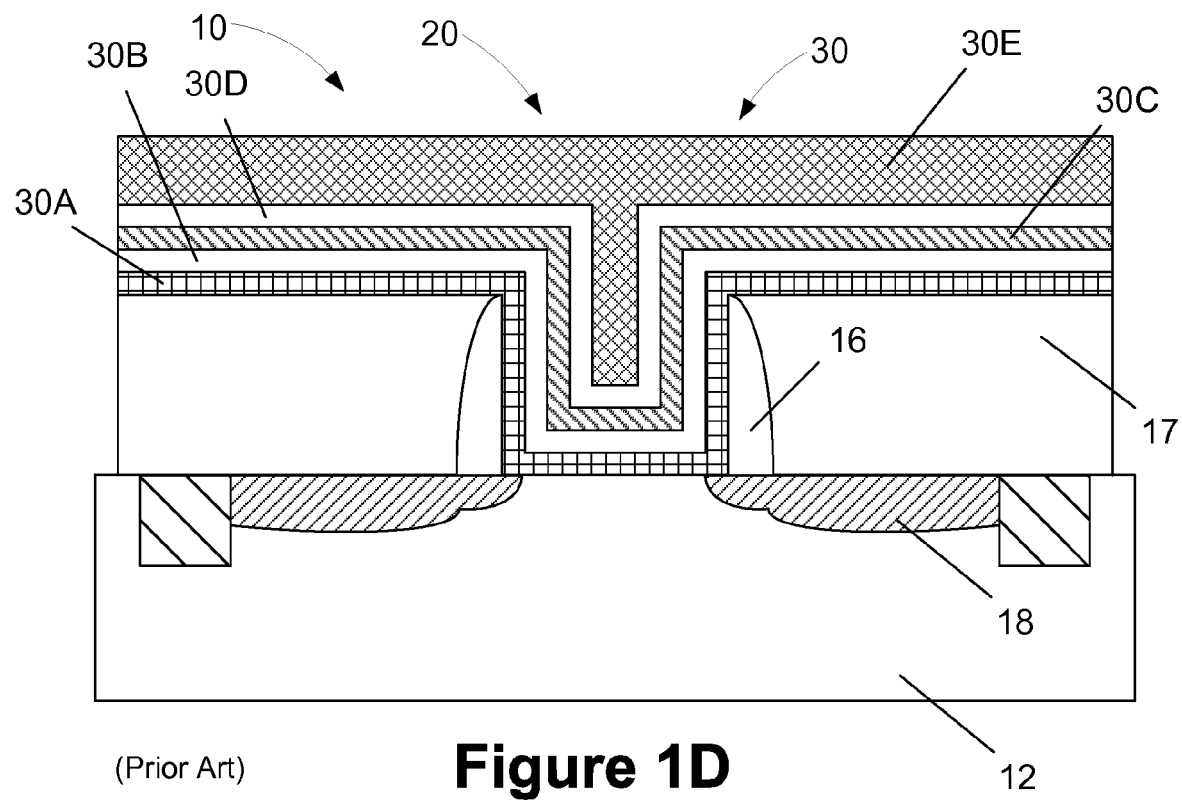
(Prior Art) Figure 1D

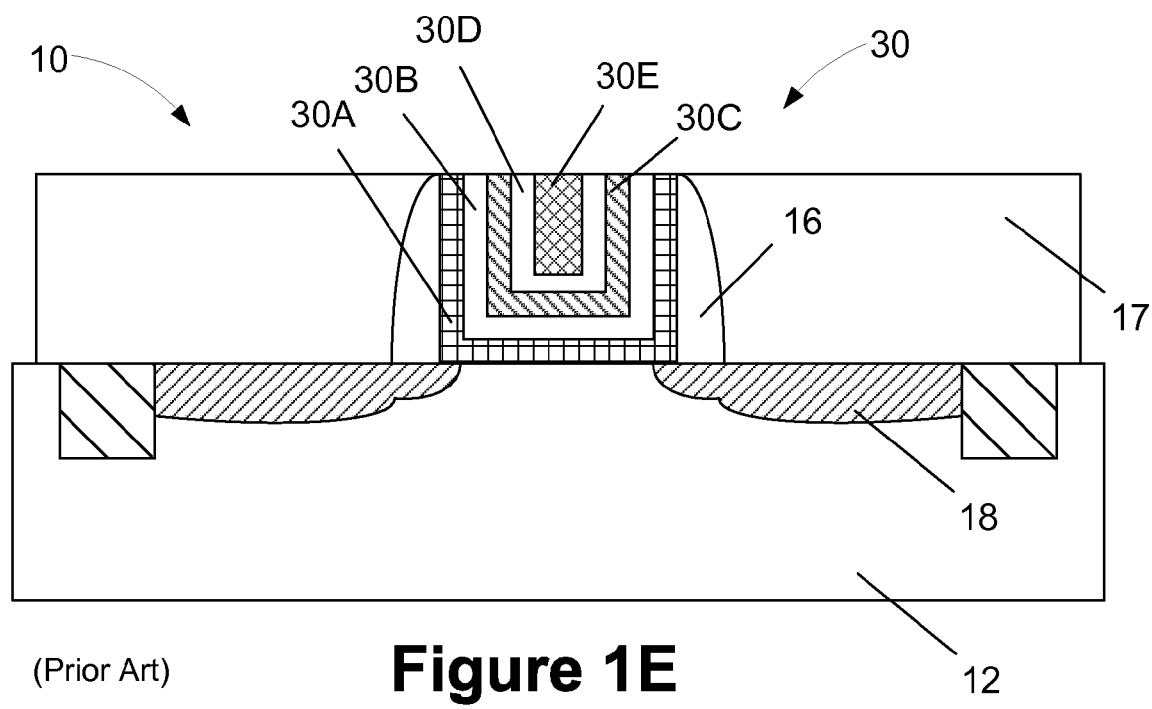
(Prior Art) Figure 1E
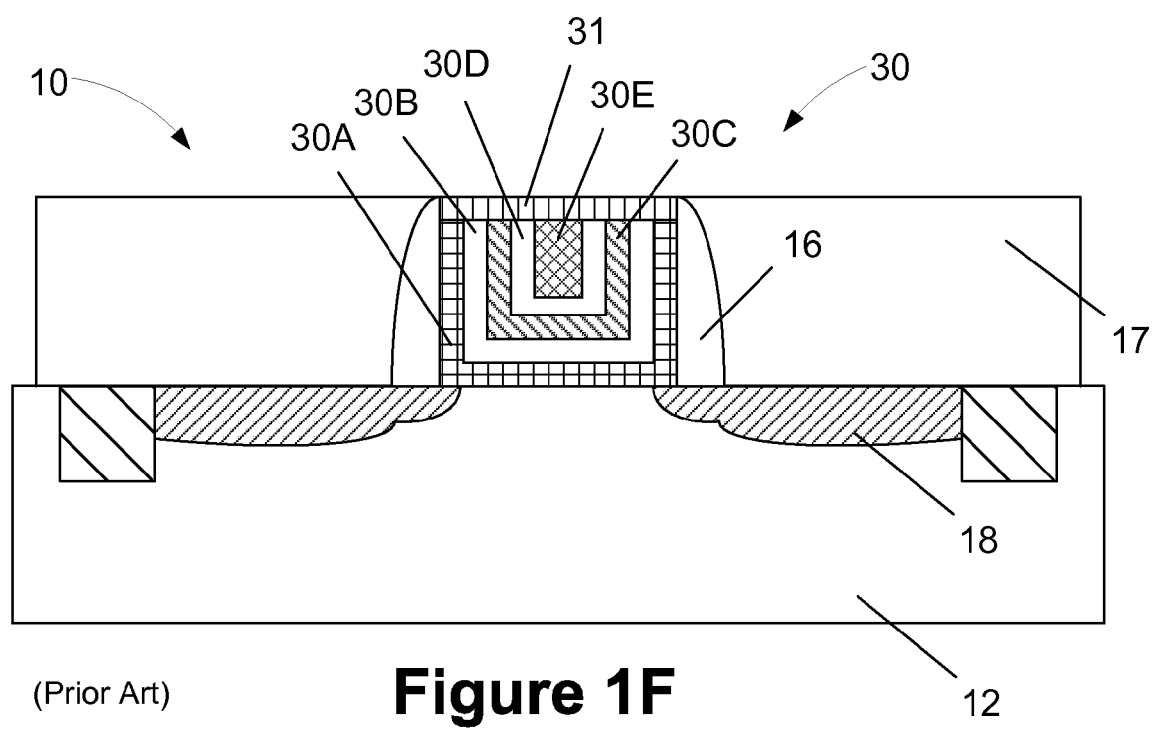
(Prior Art) Figure 1F

METHODS OF FORMING GATE STRUCTURES FOR SEMICONDUCTOR DEVICES USING A REPLACEMENT GATE TECHNIQUE AND THE RESULTING DEVICES

BACKGROUND OF THE INVENTION

1. Field of the Invention

The present disclosure generally relates to the fabrication of integrated circuits, and, more particularly, to various methods of forming gate structures for semiconductor devices, such as transistors, using a replacement gate technique and the resulting semiconductor devices.

2. Description of the Related Art

In modern integrated circuits, such as microprocessors, storage devices and the like, a very large number of circuit elements, especially transistors, are provided and operated on a restricted chip area Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size.

In the FinFET device, the gate structure D may enclose both the sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times ($2x$) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

For many early device technology generations, the gate structures of most transistor elements (planar and FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1F simplistically depict one illustrative prior art method for forming an HK/MG replacement gate structure using a replacement gate technique on a planar transistor device. As shown in FIG. 1B, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a replacement gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and, thereafter, performing a CMP process to remove excess portions of the gate cap material layer positioned above the surface of the layer of insulating material 17. The gate cap layer 31 is formed so as to protect the underlying gate materials during subsequent processing operations.

As the gate length of transistor devices has decreased, the physical size of the gate cavity 20 has also decreased. Thus, it is becoming physically difficult to fit all of the layers of material needed for the replacement gate structure 30 within such reduced-size gate cavities, particularly for NMOS devices, due to the greater number of layers of material that are typically used to form the gate structures for the NMOS devices. For example, as gate lengths continue to decrease, voids or seams may be formed as the various layers of material are deposited into the gate cavity 20. FIG. 1G is a somewhat enlarged view of an illustrative NMOS device that is provided in an attempt to provide the reader with some idea of just how limited the lateral space 20S is within the gate cavity 20 of an NMOS device as the various metal layers 30A-30D are formed in the gate cavity 20. In FIG. 1G, the internal sidewall surfaces of the spacers 16 define a gate cavity 20 having a substantially uniform width 20S throughout the height or depth of the gate cavity 20. As the layers of material in the gate stack for the device are formed in the cavity 20, the remaining space 39 within the gate cavity 20 becomes very small. As the latter metal layers are formed, the lateral space 39 may be about 1-2 nm in width or even smaller. In some cases, the space 39 may be essentially non-existent. This may lead to so-called "pinch-off" of metal layers such that voids or seams may be formed in the overall gate stack, which may result in devices that perform at levels less than anticipated or, in some cases, the formation of devices that are simply not acceptable and have to be discarded.

When manufacturing advanced integrated circuit products using replacement gate structures, particularly in situations where the products also include very tight spacing between source/drain contact structures, such as products using self-aligned source/drain contacts, some amount of the work function metals in the gate cavity 20 must be removed from the gate cavity 20 to make room for additional materials, i.e., to make room within the upper portion of the gate cavity 20 for a bulk conductor material, such as tungsten and aluminum, and a gate cap layer. This process operation is sometimes referred to as work-function chamfering. In such a work-function chamfering process, some form of a protective material must be formed in the gate cavity 20 above the metal layer 30D to protect desired portions of the underlying metal layers during the recess etching process. If the lateral space 39 (to the extent it exists) cannot be reliably filled with such a protective material, such as a flowable oxide material, then the recessing etching process cannot be performed for fear of removing undesired portions of the metal layers during the course of performing the recess etching process.

Over recent years, due to the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements.

As device dimensions have decreased, the conductive contact elements in the contact level e.g., source/drain contacts, have to be provided with critical dimensions in the same order of magnitude. For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the source/drain regions of the transistors, thereby providing self-aligned trenches which are substantially laterally delineated by the spacer structures of the gate electrode structures.

The present disclosure is directed to various methods of forming gate structures for semiconductor devices, such as transistors, using a replacement gate technique, and the resulting semiconductor devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming gate structures for semiconductor devices, such as transistors, using a replacement gate technique, and the resulting semiconductor devices. One method disclosed herein includes, among other things, forming a sacrificial gate structure above a semiconductor substrate, forming a sidewall spacer adjacent opposite sides of a sacrificial gate electrode of the sacrificial gate structure, forming a tensile-stressed layer of insulating material adjacent the sidewall spacers, performing at least one etching process to remove the sacrificial gate structure and thereby define a replacement gate cavity positioned between the sidewall spacers, forming a replacement gate structure in the replacement gate cavity, forming a tensile-stressed gate cap layer above the replacement gate structure and within the replacement gate cavity and, after forming the tensile-stressed gate cap layer, removing the tensile-stressed layer of insulating material.

Another illustrative method disclosed herein includes, among other things, forming a sacrificial gate structure above a semiconductor substrate, forming a sidewall spacer adjacent opposite sides of a sacrificial gate electrode of the sacrificial gate structure, forming a tensile-stressed layer of insulating material adjacent the sidewall spacers, wherein the tensile-stressed layer of insulating material has a tensile stress of at least 500 MPa, performing at least one etching process to remove the sacrificial gate structure and thereby define a replacement gate cavity positioned between the sidewall spacers, forming a replacement gate structure in the replacement gate cavity, forming a tensile-stressed gate cap layer above the replacement gate structure and within the replacement gate cavity, wherein the tensile-stressed layer of gate cap material has a tensile stress of at least 1 GPa, after forming the tensile-stressed gate cap layer, removing the tensile-stressed layer of insulating material, after removing the tensile-stressed layer of insulating material, forming another layer of insulating material adjacent the sidewall spacers, and forming a conductive contact structure in the another layer of insulating material that is conductively coupled to a source/drain region of the device.

One illustrative device disclosed herein includes, among other things, first and second spaced-apart gate structures positioned above a surface of a semiconductor substrate, first and second gate cap layers positioned above the first and second spaced-apart gate structures, respectively, wherein each of the first and second gate cap layers have a tapered cross-sectional configuration (i.e., a width of the gate cap layer at an upper surface of the gate cap layer is less than a width of the gate cap layer at a bottom surface of the gate cap layer), sidewall spacers positioned adjacent opposite sides of each of the first and second spaced-apart gate structures and the first and second gate cap layers, wherein facing sidewall spacers on the first and second spaced-apart gate structures define a space therebetween having a top width at a level corresponding to a height of the upper surfaces of the first and second gate cap layers that is wider than a bottom width of the space at a bottom of the space, and a conductive contact positioned in the space between the facing sidewall spacers on the first and second spaced-apart gate structures.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1G depict one illustrative prior art method of forming a gate structure of a transistor using a so-called "replacement gate" technique.

Figure 1G:
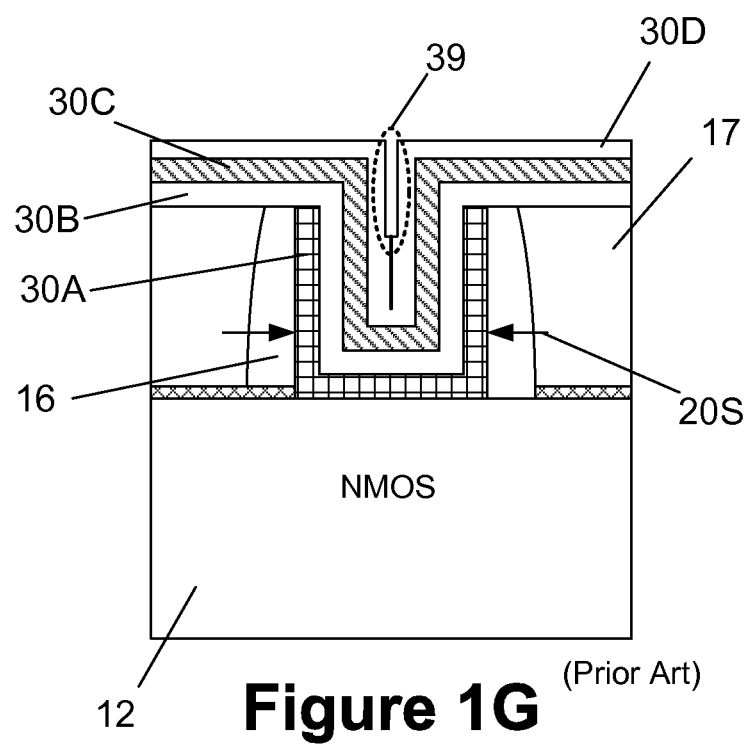

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming gate structures for semiconductor devices using a replacement gate technique. The replacement gate structure that will be depicted herein is intended to be representative in nature of any type of gate structure that may be employed in manufacturing integrated circuit products using so-called gate-last (replacement gate) manufacturing techniques. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Of course, the inventions disclosed herein should not be considered to be limited to the illustrative examples depicted and described herein. With reference to the attached figures, various illustrative embodiments of the methods and devices disclosed herein will now be described in more detail.

As will be appreciated by those skilled in the art after a complete reading of the present application, the methods and structures disclosed herein may be used when forming either planar or 3D transistor devices. An illustrative device 100 in the form of a planar transistor device 100 will be depicted for purposes of disclosing the subject matter set forth herein. Additionally, various doped regions, e.g., source/drain regions, halo implant regions, well regions and the like, are not depicted in the attached drawings. Of course, the inventions disclosed herein should not be considered to be limited to the illustrative examples depicted and described herein. Moreover, the transistor devices that are depicted in the attached drawings may be either NMOS or PMOS devices. The illustrative transistor device 100 depicted in the drawings is formed above an illustrative substrate 102 that may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. Thus, the terms "substrate" or "semiconductor substrate" should be understood to cover all semiconducting materials and all forms of such materials.

In the examples disclosed herein, the device 100 will be formed using a replacement gate technique. At the point of fabrication depicted in FIG. 2A, the device 100 includes a plurality of sacrificial gate structures 101 comprised of a sacrificial gate insulation layer 110 and a sacrificial gate electrode 112. Also depicted are a gate cap layer 116, schematically-shown sidewall spacers 114, a layer of epi semiconductor material 118 and a layer of insulating material 120. In general, prior art processing techniques, such as those generally discussed in the background section of this application, may be performed to form the replacement gate structure 101, the gate cap layer 116, the sidewall spacers 114 and the layer of epi semiconductor material 118. The device 100 depicted in FIG. 2A may be comprised of a variety of different materials. For example, the sacrificial gate insulation layer 110 may be comprised of silicon dioxide, the sidewall spacers 112 and the gate cap layer 116 may be comprised of silicon nitride and the layer of insulating material 120 may be comprised of silicon dioxide. The sidewall spacers 114 may be formed by depositing a layer of spacer material and thereafter performing an anisotropic etching process to produce the spacers 114. The illustrative layer of epi semiconductor material 118 was formed in or above the source/drain regions of the device 100. Of course, such epi semiconductor material 118 need not be formed to practice the various inventions disclosed herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 2A:
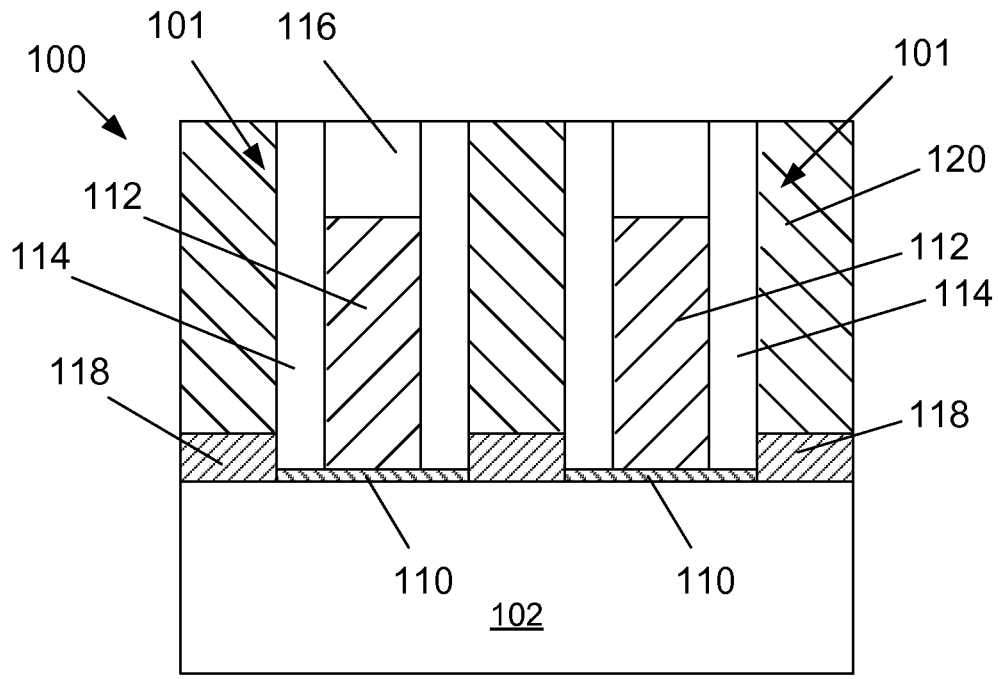
FIGS. 2A-2I depict various illustrative methods disclosed herein for forming gate structures for semiconductor devices using a replacement gate technique and the resulting semiconductor devices.

With continuing reference to FIG. 2A, unlike prior art processing techniques, the methods disclosed herein involve formation of the layer of insulating material 120 such that it is a tensile-stressed layer of insulating material. The magnitude of the tensile stress in the tensile-stressed layer of insulating material 120 may vary depending upon the particular application. For example, the tensile-stressed layer of insulating material 120 may be comprised of a flowable oxide material that is formed so as to exhibit an intrinsic tensile stress (after formation) of at least 500 MPa. Such a flowable oxide material may be formed by initially depositing the material on the substrate and thereafter performing a curing process. At the point of fabrication depicted in FIG. 2A, a chemical mechanical polishing process was performed to planarize the upper surface of the tensile-stressed layer of insulating material 120 with the upper surface of the gate cap layer 116. The thickness of the tensile-stressed layer of insulating material 120 may vary depending on the particular application. In one illustrative embodiment, the thickness of the tensile-stressed layer of insulating material may be about 100-150 nm.

Figure 2B:
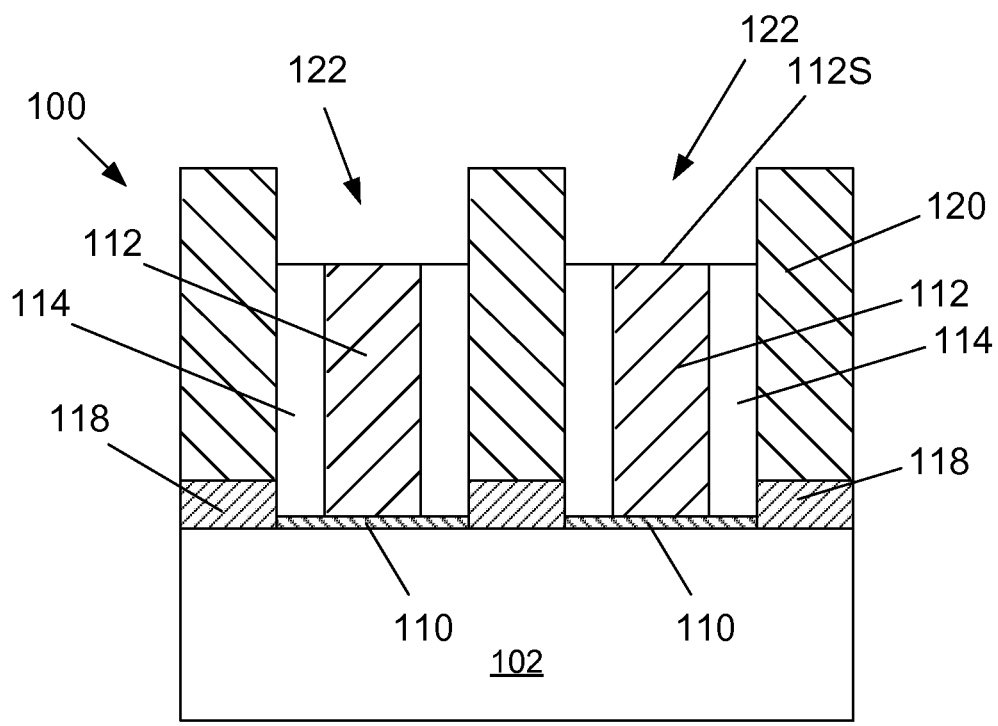

FIG. 2B depicts the product 100 after one or more etching processes were performed on the product 100 to remove the gate cap layer 116 and portions of the sidewall spacers 114 such that the upper surface 112S of the sacrificial gate electrode 112 is exposed. This process operations results in the formation of a gate cap cavity 122. The etching process that is performed may be a timed etching process so as to avoid excessive consumption of the remaining portions of the sidewall spacers 114 after the upper surface 112S of the sacrificial gate electrode 112 is exposed.

Figure 2C:
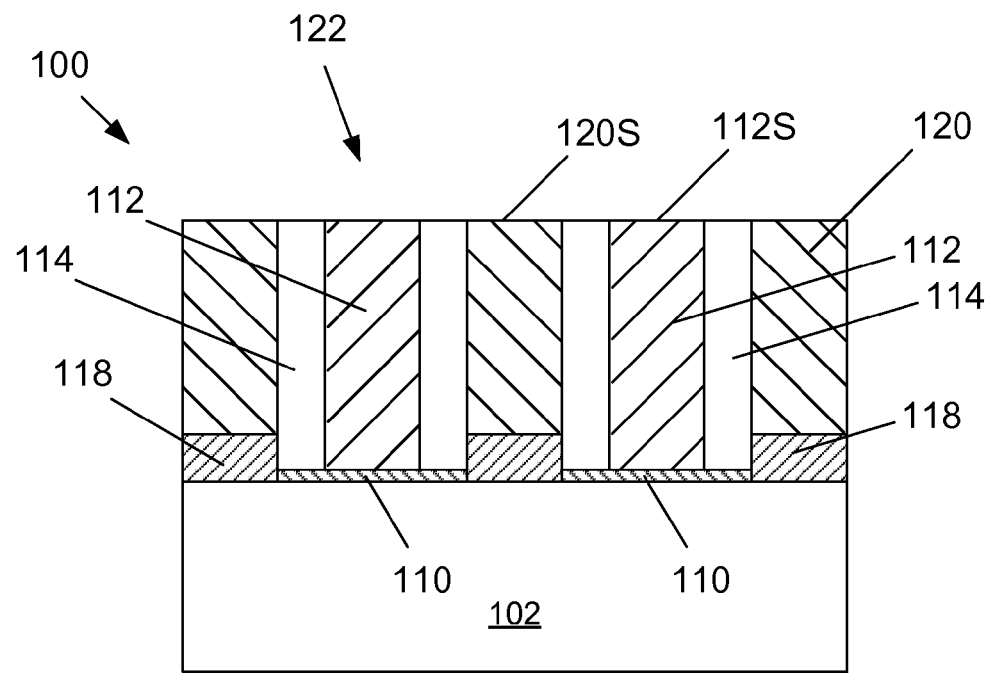

FIG. 2C depicts the device 100 after a chemical mechanical polishing (CMP) process was performed to planarize the upper surface 120S of the tensile-stressed layer of insulating material 120 with the upper surface 112S of the sacrificial gate electrode 112. As an alternative, the structure depicted in FIG. 2C may be produced by performing one or more CMP processes starting with the device depicted in FIG. 2A.

Figure 2D:
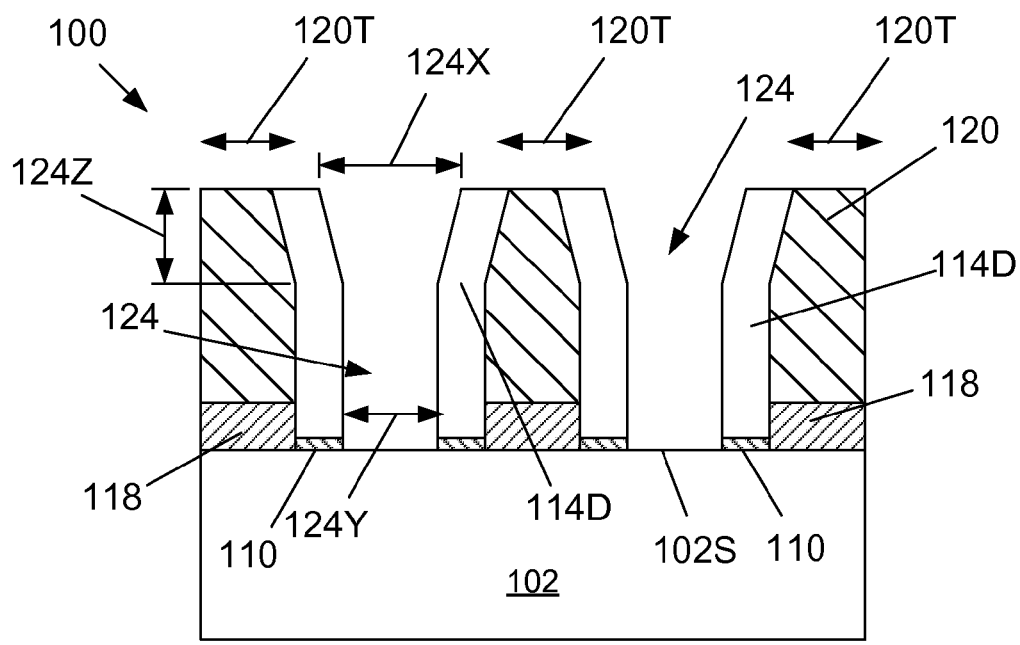

FIG. 2D depicts the device 100 after one or more wet or dry etching processes were performed to remove the sacrificial gate electrode 112 and the exposed portions of the sacrificial gate insulation layer 110 to thereby define a replacement gate cavity 124 where a replacement gate structure (the final gate structure) will subsequently be formed for the device 100. Typically, the sacrificial gate insulation layer 110 is removed as part of the replacement gate technique so as to expose the surface 102S of the substrate 102, as depicted herein. Even in cases where the sacrificial gate insulation layer 110 is intentionally removed, there will typically be a very thin native oxide layer (not shown) that forms on the surface 102S of the substrate 102 within the replacement gate cavity 124.

Unlike prior art replacement gate manufacturing techniques, due to the formation of the specially designed tensile-stressed layer of insulating material 120, when the sacrificial gate structures 101 were removed, the tensile stress (reflected by double arrowed lines 120T) in the tensile-stressed layer of insulating material 120 cause the upper portions of the sidewall spacers 114 to deflect outwardly and results in the formation of the outwardly-deflected sidewall spacers 114D shown in FIG. 2D. As a result of this deflection, the width 124X of the replacement gate cavity 124 at the upper part or entrance of the replacement gate cavity 124 is greater than the width 124Y of the replacement gate cavity 124 at a location near the bottom of the replacement gate cavity 124. The extent and degree of such outward deflection of the outwardly-deflected sidewall spacers 114D may vary depending upon the particular application. For example, in one illustrative embodiment, the entrance width 124X may fall within the range of about 20-30 nm while the bottom width 124Y may fall within the range of about 15-20 nm. In some embodiments, the outwardly-deflected sidewall spacers 114D may be outwardly-deflected, to at least some degree, for a depth of about 30-50 nm. In terms of a ratio, in some applications, using the methods disclosed herein, the entrance width 124X may be made about 10-20% wider as compared to the bottom width 124Y of the replacement gate cavity 124. Thus, replacement gate cavities 124 that are formed using the methods disclosed herein, may be more readily filled and subsequently recessed as compared to replacement gate cavities that are formed using traditional replacement gate techniques.

Figure 2E:
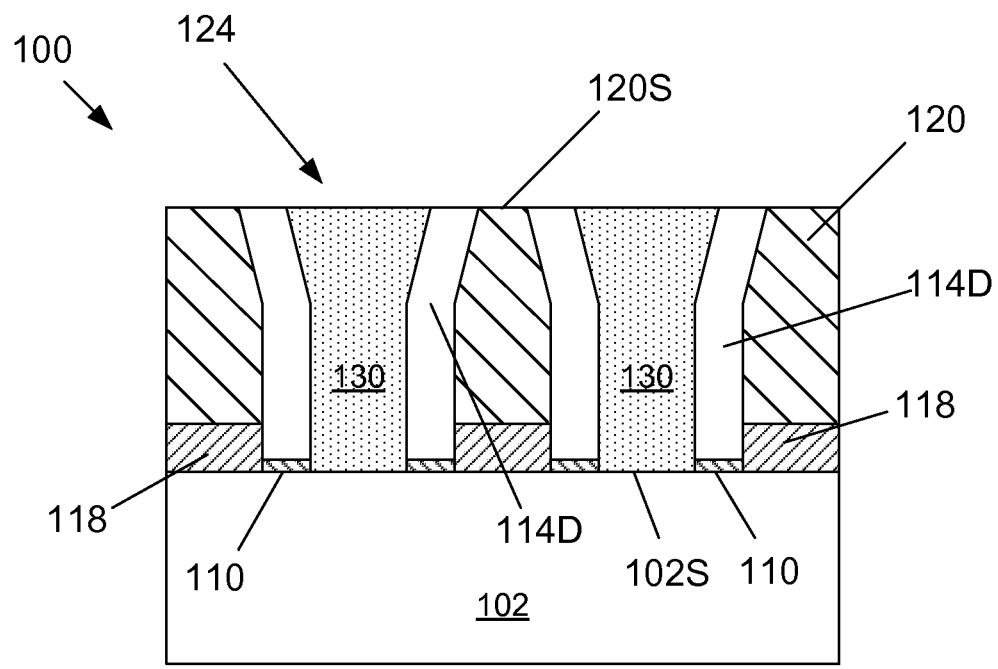
Figure 2F:
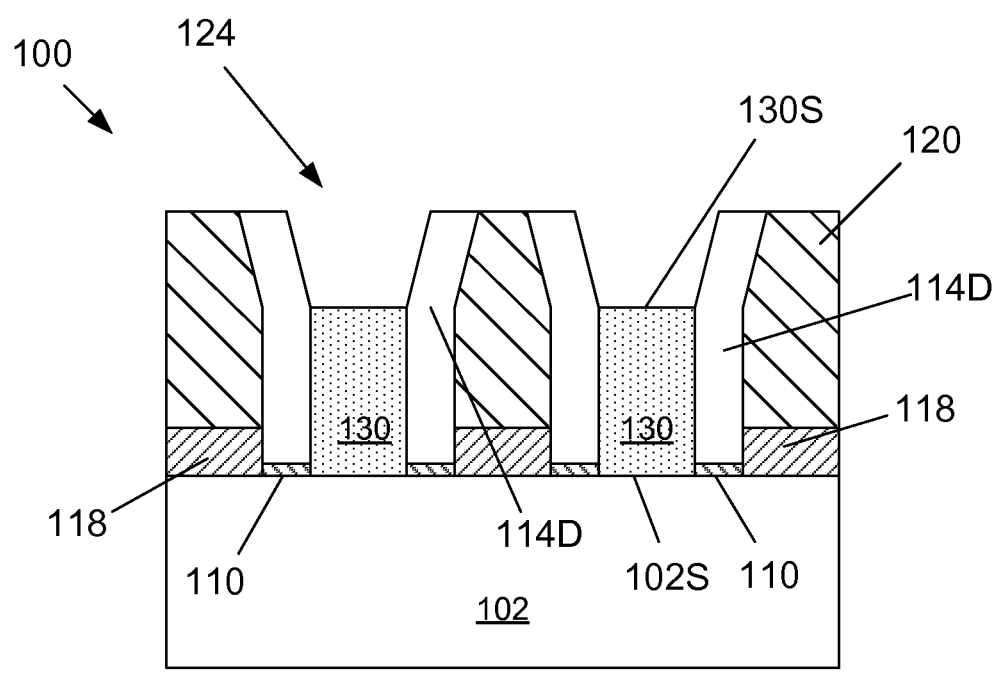

The next major process sequence involves formation of the replacement gate structure 130 for the device 100. The replacement gate structure 130 that will be depicted herein is intended to be representative in nature of any type of gate structure that may be employed in manufacturing integrated circuit products using so-called gate-last (replacement gate) manufacturing techniques. Accordingly, with reference to FIG. 2E, a pre-clean process was performed in an attempt to remove all foreign materials from within the gate cavity 124 prior to forming the various layers of material that will become part of the replacement gate structure. Next, a high-k (k-value greater than 10) gate insulation layer (not separately shown), such as hafnium oxide (or the other high-k materials noted in the background section of this application), was deposited across the device 100 and within the replacement gate cavity 124 above the substrate 102 by performing a conformal deposition process. If desired, a thin interfacial layer of silicon dioxide (not shown) may be formed prior to the formation the high-k gate insulation layer. Next, at least one work function adjusting metal layer (not shown) (e.g., a layer of titanium nitride or TiAlC depending upon the type of transistor device being manufactured) was deposited on the high-k gate insulation layer and within the replacement gate cavity 124 by performing a conformal deposition process. Of course, the work function adjusting metal layer may be comprised of any of the metals described in the background section of this application and more than one layer of work function metal may be formed in the replacement gate cavity 124, depending upon the particular device under construction. Thereafter, a CMP process was performed to remove excess portions of the high-k gate insulation layer and the one or more work-function adjusting material layers positioned above the surface 120S of the tensile-stressed layer of insulating material 120. The next process operation involves recessing the exposed upper portions of the materials deposited in the replacement gate cavity 124, i.e., the work-function chamfering process operation described in the background section of this application. To that end, FIG. 2F depicts the device 100 after one or more etching processes were performed to remove portions of the previously deposited materials in the gate cavity 124. This process operation results in a portion of a recessed replacement gate structure. Next, a bulk conductive material layer (not separately shown), such as tungsten or aluminum, was blanket-deposited above the substrate so as to over-fill the remaining portions of the replacement gate cavity 124. Thereafter, a CMP process was performed to remove excess portions of the bulk conductive material layer positioned above the surface 120S of the tensile-stressed layer of insulating material 120, i.e., the upper surface of the bulk conductive material layer was planarized such that its upper surface was approximately planar with the upper surface 120S of the tensile-stressed layer of insulating material 120. Thereafter, an etching process was performed on the bulk conductive material layer positioned within the replacement gate cavity 124 to make room for a gate cap layer. This results in the structure depicted in FIG. 2F wherein the replacement gate structure 130 has a recessed upper surface 130S. The depth of the recessing may vary depending upon the particular application.

Figure 2G:
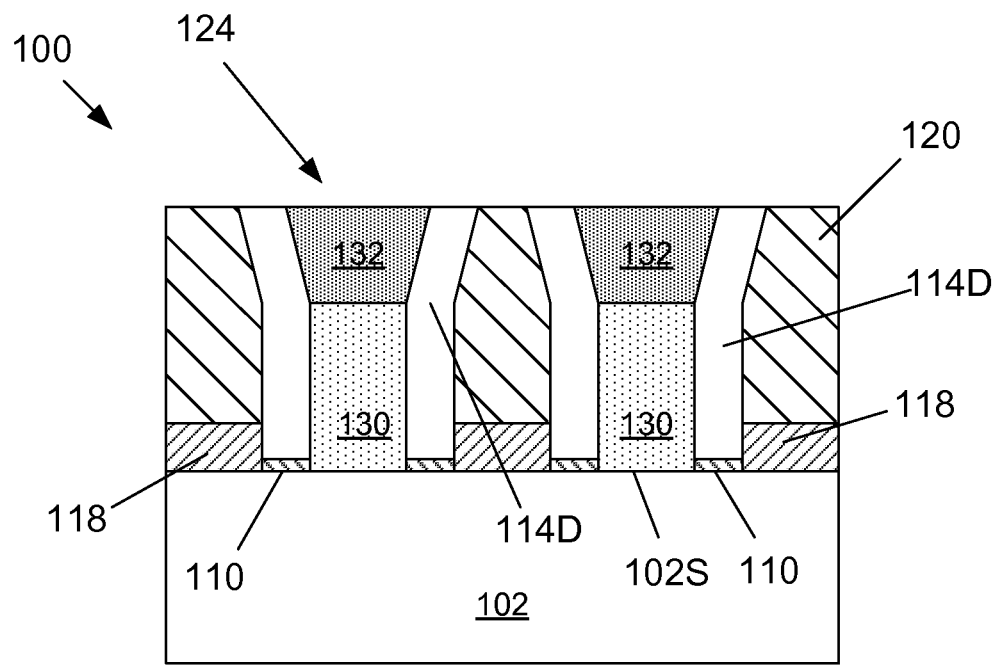

FIG. 2G depicts the device 100 after an illustrative, tensile-stressed gate cap layer 132 was formed in the recess above the recessed replacement gate structure 130 shown in FIG. 2F. The tensile-stressed gate cap layer 132 may be formed from a variety of materials, e.g., typically silicon nitride. The tensile-stressed gate cap layer 132 may be formed by depositing a layer of gate cap material so as to over-fill the recess above the recessed replacement gate 130 shown in FIG. 2G. Thereafter, a CMP process was performed to remove the excess portions of the gate cap material layer positioned above the surface of the layer of tensile-stressed layer of insulating material 120, to result in the device depicted in FIG. 2G. The magnitude of the tensile stress in the tensile-stressed gate cap layer 132 may vary depending upon the particular application. For example, the tensile-stressed gate cap layer 132 may be comprised of a silicon nitride material that is formed so as to exhibit an intrinsic tensile stress (after formation) of about 1-2.0 GPa, or at least 1.0 GPa.

Figure 2H:
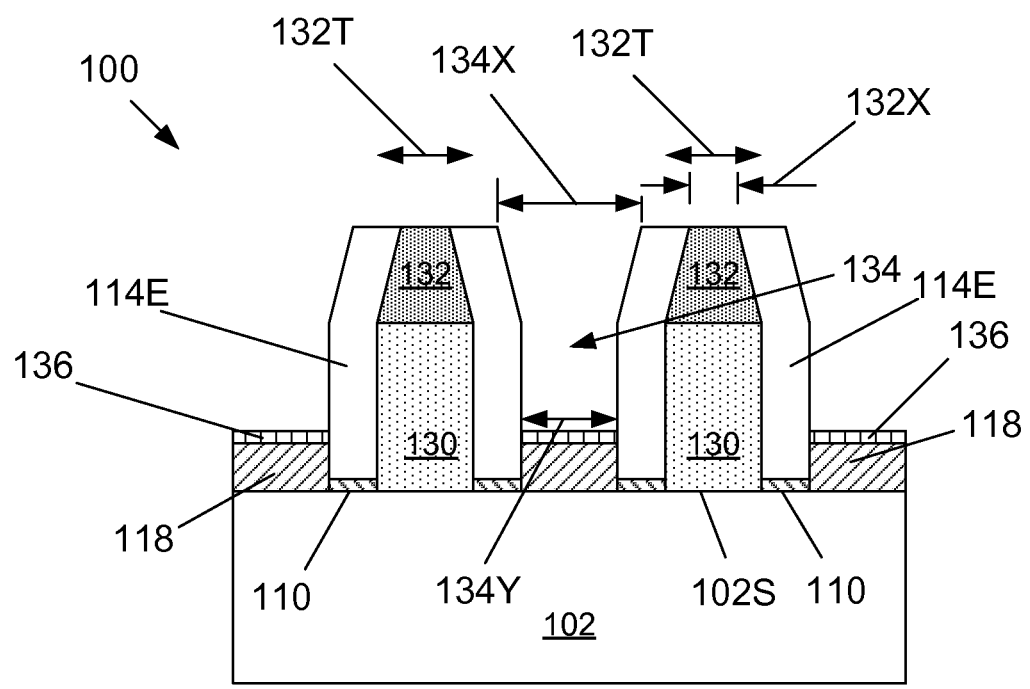

FIG. 2H depicts the device 100 after several process operations were performed. First, an etching process was performed to remove the tensile-stressed layer of insulating material 120. This process operation exposes the upper surface of the epi semiconductor layer 118. As a result of removing the tensile-stressed layer of insulating material 120, and the presence of the highly tensile-stressed gate cap layer 132, the upper portions of the outwardly-deflected sidewall spacers 114D (see FIG. 2G) deflect inwardly and results in the formation of the inwardly-deflected sidewall spacers 114E shown in FIG. 2H. That is, the tensile stress present in the tensile-stressed gate cap layer 132, as represented by the double-arrowed line 132T, causes an inward deflection of at least the upper portions of the spacers 114E. As a result of this inward deflection, the opening 134 between the sidewall spacers 114E is greater than would be present using prior art processing techniques. More specifically, the width 134X of the opening 134 between adjacent inwardly-deflected sidewall spacers 114E at the upper part of the opening 134 is greater than the width 134Y of the opening 134 at a location near the bottom of the opening 134. The extent and degree of such inward deflection of the inwardly-deflected sidewall spacers 114E may vary depending upon the particular application. For example, in one illustrative embodiment, the entrance width 134X may fall within the range of about 10-100 nm while the bottom width 134Y may fall within the range of about 6-80 nm. In some embodiments, the inwardly-deflected sidewall spacers 114E may be inwardly-deflected, to at least some degree, for a depth of about 3-30 nm from the upper surface of the tensile-stressed gate cap layer 132. In terms of a ratio, in some applications, using the methods disclosed herein, the opening width 134X may be made about 10-30% wider as compared to the bottom width 134Y of the opening between the spacers 114E. With continuing reference to FIG. 2H, after the tensile-stressed layer of insulating material 120 is removed, illustrative metal silicide regions 136 are formed on the exposed portions of the epi semiconductor material 118 using known metal silicide formation techniques. Thus, the openings 134 that are formed using the methods disclosed herein may be more readily filled as compared to corresponding openings that are formed using traditional contact opening formation techniques. In addition, the resulting larger volume of the source/drain contacts formed in the larger contact openings may result in lower contact resistance with such an enlarged contact metal volume while not sacrificing gate metal volume.

Figure 2I:
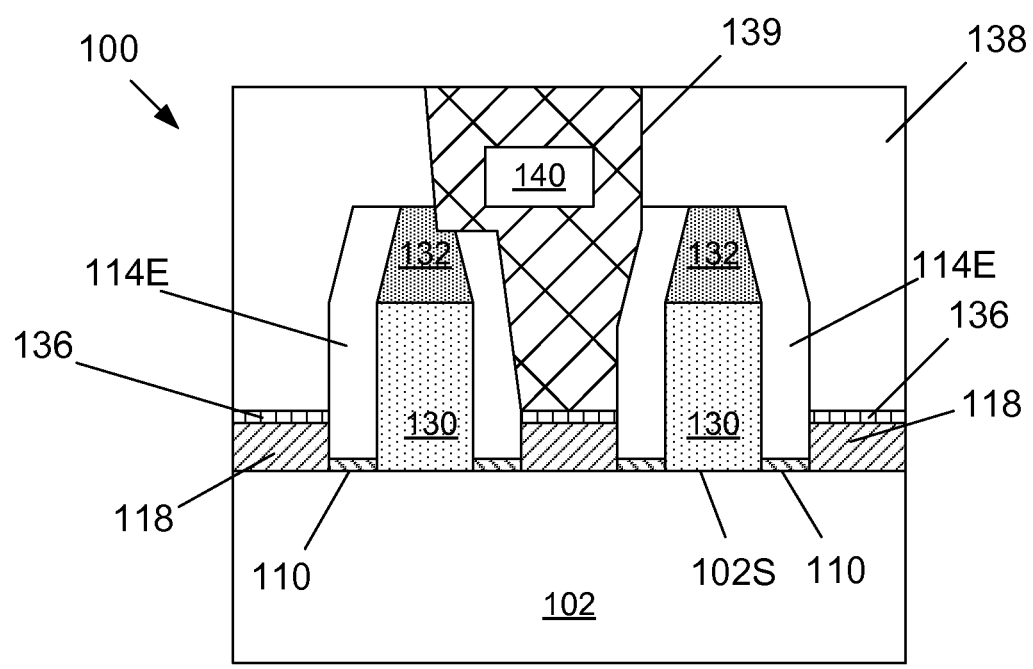

FIG. 2I depicts the device 100 after several process operations were performed. First, a layer of insulating material 138 was deposited across the product 100. The layer of insulating material 138 may be comprised of a variety of different materials, such as silicon dioxide, a low-k (k-value less than 3.3) material, etc., and it may be formed by performing a variety of techniques, e.g., CVD, etc. The thickness of the layer of insulating material 138 may vary depending upon the particular application. In some embodiments, prior to the formation of the layer of insulating material 138, a relatively thin etch-stop layer (not shown), such as a thin layer of silicon dioxide, may be formed on the metal silicide regions 110 and above the tensile-stressed gate cap layer 132 so as to protect the metal silicide regions 110 during the process of forming the opening for the self-aligned contact, as described more fully below.

Next, with continuing reference to FIG. 2I, a contact opening 139 was formed in the layer of insulating material 138 and an illustrative conductive, self-aligned contact structure 140 was formed in the self-aligned contact opening 139 such that it is conductively coupled to the metal silicide regions 110, i.e., conductively coupled to the source/drain regions of the device 100. The self-aligned contact structure 140 is intended to be schematic and representative in nature, as it may be formed using any of a variety of different conductive materials and by performing traditional manufacturing operations. The self-aligned contact structure 140 may also contain one or more barrier layers (not depicted). In one illustrative example, the self-aligned contact structure 140 may be formed by depositing a liner, e.g., a titanium nitride liner, followed by overfilling the self-aligned contact opening 139 with a conductive material, such as tungsten. Thereafter, a CMP process may be performed to planarize the upper surface of the layer of insulating material 138 which results in the removal of excess portions of the liner and the tungsten positioned above the layer of insulating material 138 outside of the self-aligned contact opening 139 and the formation of the self-aligned contact structure 140. Of course, as will be appreciated by those skilled in the art after a complete reading of the present application, although only a single conductive contact structure 140 is depicted in FIG. 2I, in practice, such self-aligned contact structures 140 will be formed to the left and right of each of the gate structures depicted in FIG. 2I.

Based upon the foregoing description, those skilled in the art will appreciate that the present application discloses several novel methods and devices. For example, relative to prior art techniques, as a result of the outward deflection of the spacers 114D, the width 124X of the replacement gate cavity 124 at the upper part or entrance of the replacement gate cavity 124 is greater than the width 124Y of the replacement gate cavity 124 at a location near the bottom of the replacement gate cavity 124. Thus, replacement gate cavities 124 that are formed using the methods disclosed herein may be more readily filled and subsequently recessed as compared to replacement gate cavities that are formed using traditional replacement gate techniques. Additionally, as a result of the inward deflection of the sidewall spacers 114E, the opening 134 between the sidewall spacers 114E is greater than would be present using prior art processing techniques. Accordingly, more space is provided for the formation of the illustrative self-aligned contact 140.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor device, comprising:
   forming a sacrificial gate structure above a semiconductor substrate;
   forming sidewall spacers adjacent opposite sides of a sacrificial gate electrode of said sacrificial gate structure;
   forming a tensile-stressed layer of insulating material adjacent said sidewall spacers;
   performing at least one etching process to remove said sacrificial gate structure and thereby define a replacement gate cavity positioned between said sidewall spacers;
   forming a replacement gate structure in said replacement gate cavity;
   forming a tensile-stressed gate cap layer above said replacement gate structure and within said replacement gate cavity; and
   after forming said tensile-stressed gate cap layer, removing said tensile-stressed layer of insulating material.

2. The method of claim 1, further comprising:
   after removing said tensile-stressed layer of insulating material, forming another layer of insulating material adjacent said sidewall spacers; and
   forming a conductive contact structure in said another layer of insulating material that is conductively coupled to a source/drain region of said device.

3. The method of claim 1, wherein forming said tensile-stressed gate cap layer comprises forming said tensile-stressed gate cap layer such that it has a tensile stress that is greater in magnitude than a tensile stress in said tensile-stressed layer of insulating material.

4. The method of claim 1, wherein forming said tensile-stressed gate cap layer above said replacement gate structure and within said replacement gate cavity comprises:
   depositing a tensile-stressed layer of gate cap material above said replacement gate structure within said replacement gate cavity and above said tensile-stressed layer of insulating material; and
   performing a chemical mechanical polishing process to remove said tensile-stressed layer of gate cap material positioned outside of said replacement gate cavity.

5. The method of claim 1, wherein said device is one of a FinFET transistor device or a planar transistor device.

6. The method of claim 1, wherein forming said tensile-stressed layer of insulating material comprises forming said tensile-stressed layer of insulating material such that it has a tensile stress of at least 500 MPa.

7. The method of claim 6, wherein forming said tensile-stressed gate cap layer comprises forming said tensile-stressed gate cap layer such that it has a tensile stress of at least 1 GPa.

8. The method of claim 1, wherein removing said replacement gate structure causes an outward deflection of at least a portion of said sidewall spacers.

9. The method of claim 8, wherein removing said tensile-stressed layer of insulating material causes an inward deflection of at least a portion of said sidewall spacers.

10. A method of forming a transistor device, comprising:
    forming a sacrificial gate structure above a semiconductor substrate;
    forming sidewall spacers adjacent opposite sides of a sacrificial gate electrode of said sacrificial gate structure;
    forming a tensile-stressed layer of insulating material adjacent said sidewall spacers, said tensile-stressed layer of insulating material having tensile stress of at least 500 MPa;
    performing at least one etching process to remove said sacrificial gate structure and thereby define a replacement gate cavity positioned between said sidewall spacers;
    forming a replacement gate structure in said replacement gate cavity;
    forming a tensile-stressed gate cap layer above said replacement gate structure and within said replacement gate cavity, wherein said tensile-stressed gate cap layer has a tensile stress of at least 1 GPa;
    after forming said tensile-stressed gate cap layer, removing said tensile-stressed layer of insulating material;
    after removing said tensile-stressed layer of insulating material, forming another layer of insulating material adjacent said sidewall spacers; and
    forming a conductive contact structure in said another layer of insulating material that is conductively coupled to a source/drain region of said device.

11. The method of claim 10, wherein forming said tensile-stressed gate cap layer above said replacement gate structure and within said replacement gate cavity comprises:
    depositing a tensile-stressed layer of gate cap material above said replacement gate structure within said replacement gate cavity and above said tensile-stressed layer of insulating material; and
    performing a chemical mechanical polishing process to remove said tensile-stressed layer of gate cap material positioned outside of said replacement gate cavity.

12. The method of claim 10, wherein removing said replacement gate structure causes an outward deflection of at least a portion of said sidewall spacers.

13. The method of claim 12, wherein removing said tensile-stressed layer of insulating material causes an inward deflection of at least a portion of said sidewall spacers.

14. A device, comprising:
    first and second spaced-apart gate structures positioned above a surface of a semiconductor substrate;
    first and second dielectric gate cap layers positioned above said first and second spaced-apart gate structures, respectively, each of said first and second dielectric gate cap layers having a tapered cross-sectional configuration wherein a width of the dielectric gate cap layer at an upper surface of the dielectric gate cap layer is less than a width of the dielectric gate cap layer at a bottom surface of the dielectric gate cap layer;
    sidewall spacers positioned adjacent opposite sides of each of said first and second spaced-apart gate structures and said first and second dielectric gate cap layers, wherein facing sidewall spacers on said first and second spaced-apart gate structures define a space therebetween having a top width at a level corresponding a height of said upper surfaces of said first and second dielectric gate cap layers that is wider than a bottom width of said space at a bottom of said space; and a conductive contact positioned in said space between said facing sidewall spacers on said first and second spaced-apart gate structures.

15. The device of claim 14, wherein said device is one of a FinFET transistor device or a planar transistor device.

16. The device of claim 14, wherein said first and second dielectric gate cap layers each have a tensile stress of at least 1 GPa.

17. The device of claim 14, wherein each of said first and second dielectric gate cap layers comprise silicon nitride.

18. The device of claim 14, wherein said conductive contact is a self-aligned contact that directly contacts at least one of said first and second dielectric gate cap layers and a facing sidewall spacer positioned adjacent at least one of said respective first and second spaced-apart gate structures.

19. The device of claim 14, wherein said top width of said space between said first and second spaced-apart gate structures is approximately 10-30% wider than said bottom width of said space between said first and second spaced-apart gate structures.

20. The device of claim 14, wherein each of said first and second spaced-apart gate structures is an HK/MG gate structure comprising a high-k gate insulation layer and at least one work function adjusting metal layer positioned above said high-k gate insulation layer.

\* \* \* \* \*